United States Patent [19]

Peterson

[11] Patent Number: 5,589,800

[45] Date of Patent: *Dec. 31, 1996

[54] DUAL VOLTAGE LEVEL SHIFTED, CASCODED CURRENT MIRROR

[75] Inventor: Kirk D. Peterson, Plano, Tex.

[73] Assignee: Texas Instruments Incorporated, Dallas, Tex.

[*] Notice: The term of this patent shall not extend beyond the expiration date of Pat. No. 5,515,010.

[21] Appl. No.: 481,907

[22] Filed: Jun. 7, 1995

Related U.S. Application Data

[63] Continuation of Ser. No. 313,526, Sep. 26, 1994, Pat. No. 5,515,010.

[51] Int. Cl.[6] .................................................. H03F 3/16
[52] U.S. Cl. ............................................ 330/288; 323/315
[58] Field of Search ..................................... 323/315, 316; 330/288

[56] References Cited

U.S. PATENT DOCUMENTS

| | | | |
|---|---|---|---|
| 4,471,292 | 9/1984 | Schenck et al. | 323/315 |
| 4,583,037 | 4/1986 | Sooch | 323/315 |
| 5,311,115 | 5/1994 | Archer | 323/315 |

OTHER PUBLICATIONS

Babanezhad, J. N. and Gregorian, R., *A Programmable Gain/Loss Circuit*, IEEE Journal of Solid–State Circuits, vol. SC–22, No. 6, Dec., 1987, pp. 1082–1090.

Alvarez, A. R., Aspen Semiconductor Corp., *BiCMOS Technology and Applications*, Kluwer Academic Publishers, 1989, pp. 290–293.

Gray, P. R. and Meyer, R. G., University of California, *Analysis and Design of Analog Integrated Circuits*, John Wiley & Sons, 1977, pp. 197–261.

*Primary Examiner*—James B. Mullins
*Attorney, Agent, or Firm*—Warren L. Franz; Wade James Brady, III; Richard L. Donaldson

[57] ABSTRACT

A current mirror circuit (40) includes a first pair of mirrored transistors ($T_1$ and $T_2$) having common gate and source connections; a second pair of cascoded transistors ($T_3$ and $T_4$) with common gate connections, respectively connected in series between the first pair transistors ($T_1$ and $T_2$) and input and output voltage terminals (+$V_{IN}$ and +$V_{OUT}$). First and second voltage level shifter circuitries (41,42) establish shifted bias voltages respectively at the first and second pair transistor gate connections. The first voltage level shifter comprises a pair of transistors ($T_5$ and $T_6$) connected in series between an applied voltage terminal and the second pair transistor source connections, for establishing a shifted biasing voltage at the second pair transistor gate connection. The second voltage level shifter comprises a pair of transistors ($T_7$ and $T_9$) connected in series between the applied voltage terminal and the first pair transistor source connections, for establishing a bias voltage at the first pair transistor gate connections.

22 Claims, 3 Drawing Sheets

DUAL VOLTAGE LEVEL SHIFTED, CASCODED CURRENT MIRROR

This is a continuation of application Ser. No. 08/313,526, filed Sep. 26, 1994, now U.S. Pat. No. 5,515,010.

This invention relates generally to transistor current source circuits; and, in particular, to cascode current mirror circuits employing voltage level shifting among cascoded transistor pairs to thereby enhance output voltage swing and power source rejection characteristics.

BACKGROUND OF THE INVENTION

Current mirror circuits of the type to which the present invention relates are widely used as basic building blocks in the design of linear analog integrated circuits. They may be employed as biasing elements, active loads (e.g., such as in amplifier stages) or as all-purpose current sources (e.g., such as bit current cells in analog-to-digital converters). Basic topologies for conventional current mirror circuits that have proven usefull are the simple current mirror, Wilson mirror, enhanced Wilson mirror, Widlar mirror, cascode mirror and enhanced cascode mirror. A general background discussion of conventional mirrors is set forth in U.S. Pat. No. 5,311,115, the disclosure of which is incorporated herein by reference.

A current mirror is a current input/output device which, ideally, has zero input impedance and infinite output impedance, so that current output remains a fixed function of current input, regardless of variations in output load, variations in output voltage or fluctuations in applied power source. To achieve the desired large output impedance typically requires some form of cascoding or stacking of output devices, in order to multiply the output resistance available from a single device. The need to do this becomes increasingly more important, as process minimum geometries continue to shrink and output resistances of short channel length devices continue to drop. An undesirable side effect of cascoding, however, is that output voltage swing (range of output voltage for which the output resistance remains high) becomes limited due to the need to maintain additional series-connected devices in their desired (e.g., saturated for MOS devices) operating regions. This problem of loss of voltage range is further compounded by a trend toward lower voltage power supplies in small geometry processes. For example, losing 1.25 volts of output range can be significant, resulting in total output swings of only 2.5 volts, where a 5.0 volt voltage supply is involved.

In addition to the above-referenced U.S. Pat. No. 5,311,115, general background information relating to current mirror circuits is also given in Gray & Meyer, Analysis and Design of Analog Integrated Circuits, Ch.4 (1977 John Wiley & Sons) and Alvarez, BiCMOS Technology and Applications, Sec. 8.3 (1989 Kluwer Academic Publishers). And, though particular embodiments discussed herein are implemented utilizing N-channel MOS circuit technology, it should be understood that the same circuits may also be implemented utilizing complementary (viz. P-channel) devices or other (viz. bipolar or BiCMOS) technologies.

FIG. 1 illustrates a prior art simple current mirror 10 implemented using N-channel MOS transistors. The considerations surrounding a simple bipolar current mirror are similar and are discussed in the Gray & Meyer and Alvarez references noted above. In addition, various substrate connections are equally viable, though not explicitly drawn.

Ideally, the function of current mirror 10 is to match channel current $I_{OUT}$ through transistor $T_2$ to channel current $I_{IN}$ through transistor $T_1$, in order that current $I_{OUT}$ "mirrors" current $I_{IN}$. Transistor $T_1$ is diode-connected to place it in saturation, with $V_{DS1} \geq V_{GS1}$. The gate of transistor $T_2$ is connected to the gate of transistor $T_1$, and the sources of transistors $T_1$ and $T_2$ are connected to a common voltage source (viz. ground), so that the gate-to-source voltages of transistors $T_1$ and $T_2$ are equal ($V_{GS2}=V_{GS1}$). Therefore, when transistor $T_2$ also operates in saturation, the channel current $I_{OUT}$ through transistor $T_2$ is equal to some pre-established fixed multiple of channel current $I_{IN}$ through transistor $T_1$. This is true for devices operating both above threshold ($V_{GS} \geq V_T$) and in the subthreshold region ($V_{GS} < V_T$).

For transistors $T_1$ and $T_2$ formed on the same integrated circuit and having identical parameters, for $V_{GS2}=V_{GS1}$, the output and input currents will be equal ($I_{OUT}=I_{IN}$). However, transistors $T_1$ and $T_2$ can be formed with different channel lengths and widths so that the currents $I_{OUT}$ and $I_{IN}$ will have a constant aspect ratio $A_i$, which can be either less than or greater than unity, and which is defined by the relationship:

$$A_i = \frac{I_{OUT}}{I_{IN}} = \frac{W_2/L_2}{W_1/L_1} ; \qquad (1)$$

where $W_1$=channel width of transistor $T_1$;

$W_2$=channel width of transistor $T_2$;

$L_1$=channel length of transistor $T_1$; and $L_2$=channel length of transistor $T_2$.

Thus, the task of selecting a desired current aspect ratio is simplified to selecting transistor geometry in accordance with Equation (1). Typically, $L_1=L_2$; and, thus, the relationship can be simplified to:

$$A_i = \frac{I_{OUT}}{I_{IN}} = \frac{W_2}{W_1} . \qquad (2)$$

Ideally, the output current $I_{OUT}$ should remain constant for varying output loads and/or output voltages occurring at output terminal $+V_{OUT}$. Thus, the higher the output resistance $R_{OUT}$ of a current source, the more ideal it is. For simple current mirrors, output resistance Rout is the same as the output resistance of the output rail transistors through which current $I_{OUT}$ flows (viz. transistor $T_2$ in FIG. 1 ). Over a common range of values, output resistance is roughly proportional to channel length. Yet, although it is possible to achieve higher output resistance using longer channels, the parasitic pole frequency of the mirror will be lowered thereby. Also, unless the gate width is scaled proportionately, the gate-to-source voltage may become excessively large, increasing the requirements for saturation voltage. Output current $I_{OUT}$ may also fluctuate due to the fact that $V_{DS1}$ is not necessarily equal to $V_{DS2}$ and, thus, the modulation of drain current as the drain voltage varies causes a variation of $I_{OUT}$.

Because of the importance of high output resistance, cascoding or stacking of transistors is often preferred. A conventional cascode current mirror 20 is shown in FIG. 2. Cascode current mirror 20 minimizes variations in $I_{OUT}/I_{IN}$ due to output resistance $R_{OUT}$. The cascode mirror 20 is characterized by the addition of a second mirrored pair of transistors $T_3$ and $T_4$, respectively connected between the first pair of transistors $T_1$ and $T_2$ and the input/output terminals, as shown. Again, for discussion purposes, the illustrative circuit is implemented using N-channel MOS elements; however, those skilled in the art to which the invention relates will appreciate that P-channel MOS device, as well as bipolar and BiCMOS, implementations are possible.

In circuit 20, transistor $T_3$ is diode-connected to place it in saturation, with its drain connected to input terminal $+V_{IN}$ and its source connected to the drain of transistor $T_1$. Transistor $T_4$ has its drain connected to output terminal $+V_{OUT}$ and its source connected to the drain of transistor $T_2$. With the gate of transistor $T_3$ connected to the gate of transistor $T_4$, current $I_{IN}$ flowing through transistors $T_1$, $T_3$ and current $I_{OUT}$ flowing through transistors $T_2$, $T_4$ are related in accordance with a fixed aspect ratio of transistors $T_1$, $T_2$, as for the simple mirror circuit 10 of FIG. 1. Cascode current mirror 20 is, in effect, a cascaded series of two current mirrors 10 of FIG. 1. And, assuming all operational parameters of transistors $T_1$ through $T_4$ are identical (i.e., the threshold voltages of the devices are identical and $L_1=L_2$, $L_3=L_4$, and $W_2/W_1 = W_4/W_3$), then drain voltage $V_{D1}$ of transistor $T_1$ will equal drain voltage $V_{D2}$ of transistor $T_2$. Thus, even though a voltage fluctuation may occur at the output terminal $+V_{OUT}$ which increases the drain voltage of transistor $T_4$, the drain current $I_{OUT}$ through transistors $T_2$ and $T_4$ will remain relatively constant. Current ratio $I_{OUT}/I_{IN}$ is thus maintained, and cascode current mirror 20 minimizes variations in $I_{OUT}/I_{IN}$ due to output resistance $R_{OUT}$.

Thus, because of the higher output impedance, circuit 20 provides a strict current gain $I_{OUT}/I_{IN}$. It also has very good power supply rejection characteristics (ability to maintain constant output current, unaffected by input power supply noise) because transistors $T_1$, $T_2$ have identical gate voltages and very similar drain voltages. There is, however, a tradeoff for achieving a higher output impedance. With the simple current mirror 10, the minimum saturation voltage required for operation is merely the excess bias $V_{D2}$, where $V_{D2}=(V_{GS1}-V_{T1})$, and $V_{D2}$ is the overdrive voltage above the threshold voltage $V_{T1}$. Because of the additional series-connected transistors, however, a greater minimum saturation voltage is required for operation of the cascode current mirror 20 of FIG. 2. For the cascoded arrangement 20, transistor $T_4$ leaves the saturation region of operation if output terminal voltage $+V_{OUT}$ drops below $V_{G2}-V_{T4}$ (typically greater than 1.0 volts away from power supply voltage). This can severely limit available output voltage swing for low voltage power supplies.

FIG. 3 shows a conventional enhanced cascode mirror 30, which addresses the problem of the poor output voltage swing and is an attempt to simultaneously achieve high output resistance $R_{OUT}$ and a relatively low minimum saturation voltage. In this arrangement, the output cascoding device $T_4$ is biased off the source of a transistor $T_5$, instead of through direct connection with the gate of input cascoding device $T_3$, as before. The connections between transistors $T_1$ and $T_2$ are made as in circuit 20; however, a voltage level shifter 31, comprising series-connected transistors $T_5$ and $T_6$, is interposed between transistors $T_3$ and $T_4$, as shown. Transistor $T_5$ has its gate connected to the gate of diode-connected transistor $T_3$; its source connected to the gate of transistor $T_4$; and its drain connected to receive an additional reference current $I_A$ from a reference voltage terminal $+V_A$. Transistor $T_6$ has its source commonly connected to ground with the sources of transistors $T_1$ and $T_2$; its gate connected to the gates of diode-connected transistor $T_1$ and transistor $T_2$; and its drain connected to the source of transistor $T_5$. Thus, assuming all operational parameters of transistors $T_1$ through $T_6$ are suitably chosen, the voltage level shifter 31 comprised of series-connected transistors $T_5$ and $T_6$, will flow a current $I_A$ which mirrors the current $I_{IN}$ flowing through the series connection of transistors $T_1$ and $T_3$. The voltage potential at the source of transistor $T_5$ will thus be similar to the voltage potential at the required to keep transistor $T_4$ of circuit 30 in the saturated region. Because the voltage at source of transistor $T_4$ of circuit 20; thereby lowering the minimum voltage the gate of transistor $T_4$ in circuit 30 has been systematically "shifted" below the gate voltage of transistor $T_4$ in circuit 20 (now applied as the gate voltage of transistor $T_5$ in circuit 30) by an amount $\Delta V=V_{GS5}$ (typically 1–2 volts), the mirror can maintain high output resistance while swinging substantially closer to the power supply. To prevent driving the output rail device $T_2$ into the linear region, transistor $T_3$ can be made somewhat longer to increase the gate voltages of transistors $T_3$ and $T_5$. With appropriate sizing, transistor $T_3$ can set the drain voltage of transistor $T_2$ to below 0.25 volts.

Unfortunately, because of the diode connections of transistors $T_1$ and $T_3$ and insertion of the voltage shifter 31 in circuit 30, second order variations in the drain-to-source voltages of the mirroring components will adversely vary the fixed relationship of $I_{OUT}/I_{IN}$ for AC noise components on the DC input power supply. Because the drain voltages of the input rail device $T_1$ and the output rail device $T_2$ are no longer equal, the current gain is no longer precisely determined strictly by the ratio of device sizes, and influences due to the lambda effect must now be considered. The problem with the lambda effect is particularly severe with new small geometry processes (with short channel lengths), wherein the device output resistance is quite low. Similarly, the lack of symmetry looking up into the mirror from the power supply (unequal drain voltages and unequal impedances seen at the drains) causes the power supply rejection to be poor.

To date, the problem of simultaneously achieving the strict current gain, good power supply rejection and good output voltage swing has had no good solution. One proposed solution is disclosed in Babanezhad and Gregorian in the December, 1987, IEEE Journal of Solid-State Circuits (BG1082). This arrangement, however, requires two identical input currents, which is undesirable.

SUMMARY OF THE INVENTION

The present invention provides an improved current mirror device that combines the advantageous features of both the well-known cascode current mirror and the well-known enhanced cascode current mirror. In particular, the strict current gain and good power supply rejection characteristics of the conventional cascode current mirror are maintained, while simultaneously giving the excellent output voltage range characteristics of the conventional enhanced current mirror.

In accordance with the invention, an improved current mirror device is provided that matches the gate voltages, drain voltages and drain impedances of the mirrored transistors to achieve a high output resistance, good voltage swing with low power supplies, and good power supply rejection. A first transistor pair is connected in mirroring fashion, with another transistor pair added in series in cascoding fashion. A first voltage level shifter circuit or gate driving circuitry is connected to shift the voltage potential between the output current path transistors and, in accordance with the invention, a second voltage level shifter circuit is added to shift the voltage potential between the input current path transistors. Such dual shifting serves to equalize the control terminal voltages (viz. gate voltages in MOS implementations and base voltages in bipolar implementations) of both the mirroring and cascoded transistor pairs, thereby presenting a better matching between input and output current pairs to transients appearing on the power source, without sacrificing benefits of voltage level shifting on current mirror voltage swing.

BRIEF DESCRIPTION OF THE DRAWINGS

Embodiments of the invention have been chosen for purposes of illustration and description, and are shown with reference to the accompanying drawings, wherein.

Throughout the drawings, like elements are referred to by like numerals.

DETAILED DESCRIPTION OF PREFERRED EMBODIMENTS

Figure 4:
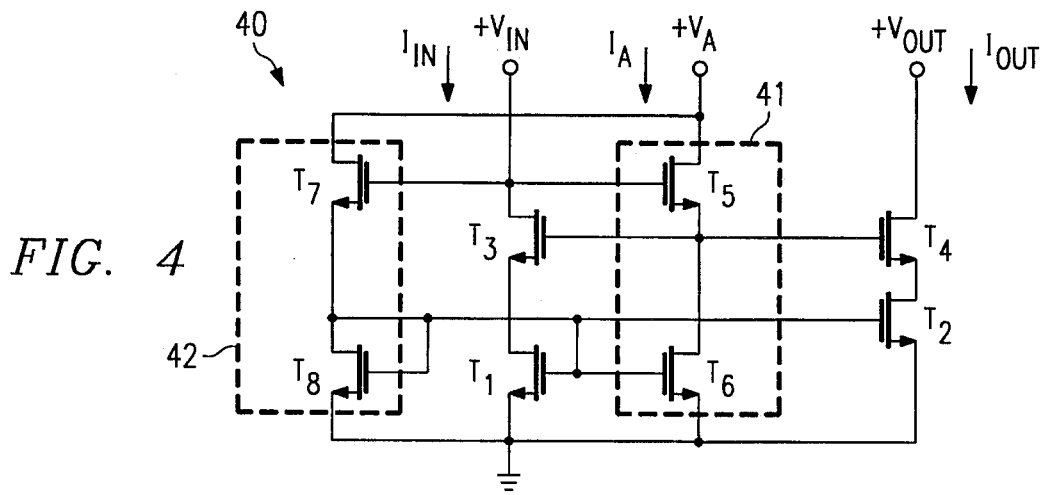
FIG. 4 is a schematic diagram of an improved current mirror circuit, in accordance with the principles of the invention.

In accordance with an illustrative embodiment of the invention, an improved cascode mirroring circuit 40 is given in FIG. 4. Circuit 40 provides a current mirror design which simultaneously achieves high output resistance, good power supply rejection and good output voltage swing. Though N-channel MOS components are shown, it will be appreciated that the same principles can be implemented using P-channel MOS components, bipolar or BiCMOS components. A transistor is a three terminal semiconductor device in which a voltage applied between a first terminal and a second or third terminal can control current flow in a current path or channel between the second and third terminals. In a MOS field effect transistor, the first or control terminal is referred to as the "gate" and the second and third terminals are referred to as the "source" and "drain". In bipolar transistors, the same terminals are respectively referred to as "base", "emitter" and "collector". The terms "gate", "source" and "drain" as used herein are, thus, intended to encompass the corresponding terms "base", "emitter" and "collector".

A first pair of N-channel MOS transistors $T_1$ and $T_2$ is connected in mirrored fashion, with the gate of transistor $T_1$ connected to the gate of transistor $T_2$ and with the sources of transistors $T_1$ and $T_2$ commonly connected to one terminal ("rail") of a power source (for the illustrated N-channel devices, the low voltage terminal or ground). A second pair of N-channel MOS transistors $T_3$ and $T_4$ are connected in cascoded fashion, respectively, in series with the mirrored pair. Transistor $T_3$ has its source connected to the drain of transistor $T_1$ and its drain connected to the mirror voltage input terminal $+V_{IN}$. Transistor $T_4$ has its source connected to the drain of transistor $T_2$ and its drain connected to the output voltage terminal $+V_{OUT}$. The gates of transistors $T_3$ and $T_4$ are connected to each other. Thus, the described connections resemble the transistor connections of the conventional cascoded current mirror 20, described above in reference to FIG. 2.

To reduce the minimum saturation voltage needed to operate the output leg of the circuit, a first voltage level shifter 41 is connected to control the voltage potential applied to the gates of transistors $T_3$ and $T_4$. Voltage level shifter 41 comprises transistors $T_5$ and $T_6$, connected between a voltage terminal $+V_A$ and ground, as shown. Transistor $T_5$ has its drain connected to terminal $+V_A$; its gate connected to current mirror input terminal $+V_{IN}$; and its source connected to the gates of transistors $T_3$ and $T_4$. Transistor $T_6$ has its drain connected to the source of transistor $T_5$; its gate commonly connected to the gates of transistors $T_1$ and $T_2$; and its source commonly connected to the sources of transistors $T_1$ and $T_2$ and to ground. Such connections resemble the connections of the corresponding transistors of voltage level shifter 31 in the enhanced cascode mirror arrangement 30 shown in FIG. 3, and voltage level shifter 41 functions to shift the voltage $V_{D2}$ by an amount $V_{GS5}$ compared to circuit 20 discussed above in reference to FIG. 2. In departure from the arrangement shown in FIG. 3, however, a second voltage level shifter 42 is connected to control the voltage potential applied to the gate of transistors $T_1$ and $T_2$. It is noted that the configuration of transistors $T_1$, $T_7$ and $T_8$ assumes the traditional Wilson mirror topology and functions in similar manner despite the addition of transistor $T_3$. Also, the gate of transistor $T_3$ is commonly connected to the source of transistor $T_5$ and the gate of transistor $T_4$, not to the gate of transistor $T_5$. This has the effect of shifting the drain voltage $V_{D1}$ also by the same amount $V_{GS5}$, thereby equalizing the drain voltages of the current mirroring transistors $T_1$ and $T_2$.

Shifter 42 comprises transistors $T_7$ and $T_8$, connected between the same voltage terminal $+V_A$ and ground as shifter 41. Transistor $T_7$ has its drain connected to terminal $+V_A$; its gate connected to current mirror input terminal $+V_{IN}$; and its source connected to the gates of transistors $T_1$, $T_2$, $T_6$ and $T_8$. Transistor $T_8$ is diode-connected, with its drain and gate connected to the source of transistor $T_7$ (and, thus, also to the gates of transistors $T_1$, $T_2$ and $T_6$); and its source connected to the sources of transistors $T_1$, $T_2$, $T_6$ and to ground. The voltage level shifter 42 serves to generate a Wilson-style gate bias for both transistors $T_1$ and $T_2$ dependent upon the input current $I_{IN}$. The gates of transistors $T_3$ and $T_4$ are commonly connected to the stepped-down voltage potential provided at the source of transistor $T_5$ of voltage level shifter 41 to improve the output voltage swing.

The improved current mirror circuit 40 provides strict current matching with high output resistance because the mirrored transistors $T_1$ and $T_2$ have the same gate voltages and nominally identical drain voltages due to the identical connections of transistors $T_3$ and $T_4$. This avoids the lambda effect error which afflicts the enhanced cascode mirror of FIG. 3, discussed above, especially when the mirror rail devices $T_1$ and $T_2$ are given short channel lengths (which is often the case).

Figure 3:
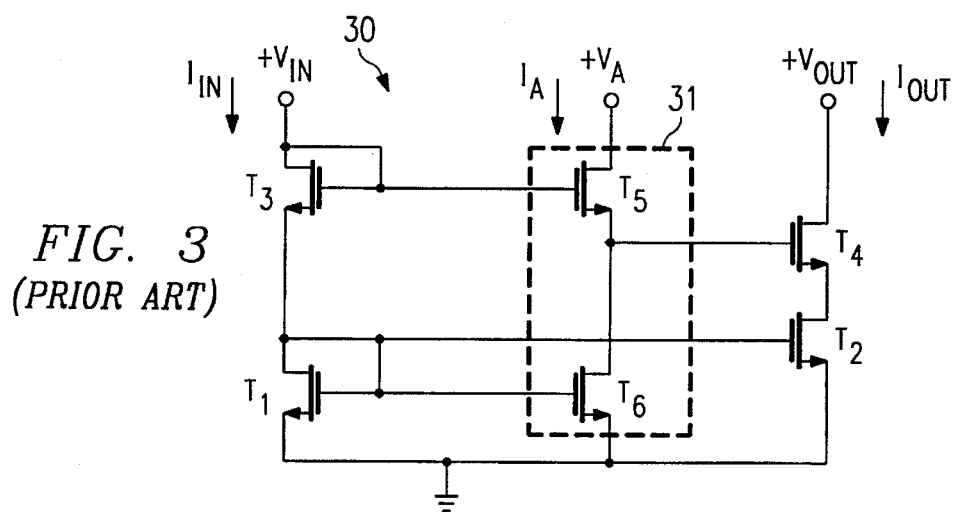
FIG. 3 (Prior Art) is a schematic diagram of a conventional enhanced cascode current mirror circuit.

The excellent output voltage swing is provided by the first voltage level shifter or source follower 41, comprised of transistors $T_5$ and $T_6$, which is similar in function to the enhanced cascode stepdown through transistor $T_5$ in FIG. 3. By lengthening transistor $T_7$ (similar to what is done with transistor $T_3$ in FIG. 3), the quiescent voltage at the drain of the output rail device $T_2$ can be set to below 0.25 volts, thereby maximizing the output voltage swing.

Figure 1:
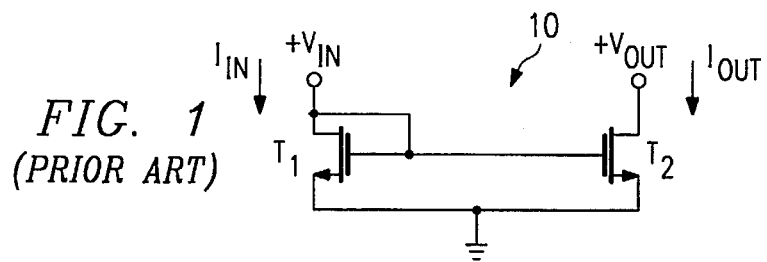
FIG. 1 (Prior Art) is a schematic diagram of a conventional simple mirror circuit.
Figure 2:
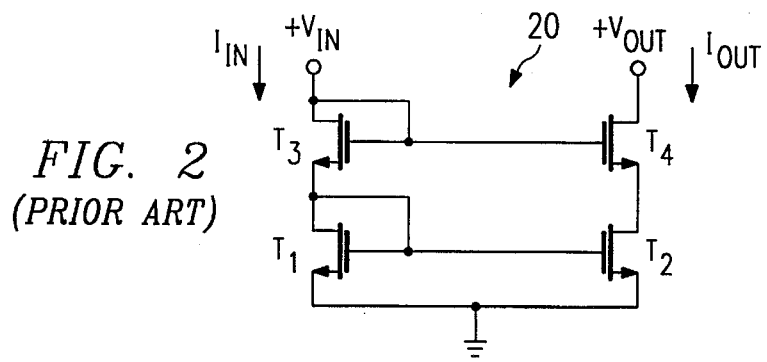
FIG. 2 (Prior Art) is a schematic diagram of a conventional cascode current mirror circuit.

The good supply rejection of the cascode mirror of FIG. 2 is matched (and even slightly improved upon). The drain voltages of the mirrored rail devices $T_1$ and $T_2$ are made nominally identical. Any mismatch is determined by the mismatch in the cascoded devices $T_3$ and $T_4$, which is analogous to the situation with the corresponding cascoded devices $T_3$ and $T_4$ in the cascoded mirror of FIG. 2. However, a second order effect is the impedance seen at the drains of the rail devices $T_1$ and $T_2$. The improved mirror 40 has identical small signal impedances at the drains of transistors $T_1$ and $T_2$ (approximately equal to 1/gm of the cascoding devices $T_3$ and $T_4$). The cascode mirror of FIG. 2, on the other hand has a factor of 2 mismatch and impedance at the drains of corresponding transistors $T_1$ and $T_2$ of FIG. 2.

The design of FIG. 4 has been simulated using the transistor models from the EPIC-1ZS (0.8µ CMOS) process, and the simulations compared with simulations of the cascode and enhanced cascode mirrors shown in FIGS. 2 and 3, using N-channel MOS field effect transistors, formed as a single integrated circuit and having widths and lengths indicated in TABLE 1.

TABLE 1

| | | \multicolumn{8}{c}{SIMULATION TOPOLOGY} | | | | | | | |
|---|---|---|---|---|---|---|---|---|---|
| | | $T_1$ | $T_2$ | $T_3$ | $T_4$ | $T_5$ | $T_6$ | $T_7$ | $T_8$ |
| Cascode (FIG. 2) | Width | 500 | 1000 | 500 | 1000 | | | | |
| | Length | 5.0 | 5.0 | 5.0 | 5.0 | | | | |
| Enhanced Cascode (FIG. 3) | Width | 500 | 1000 | 50 | 1000 | 500 | 500 | | |
| | Length | 5.0 | 5.0 | 5.0 | 5.0 | 5.0 | 5.0 | | |
| Improved Cascode (FIG. 4) | Width | 500 | 1000 | 500 | 1000 | 500 | 500 | 50 | 500 |
| | Length | 5.0 | 5.0 | 5.0 | 5.0 | 5.0 | 5.0 | 5.0 | 5.0 |

Figure 5:
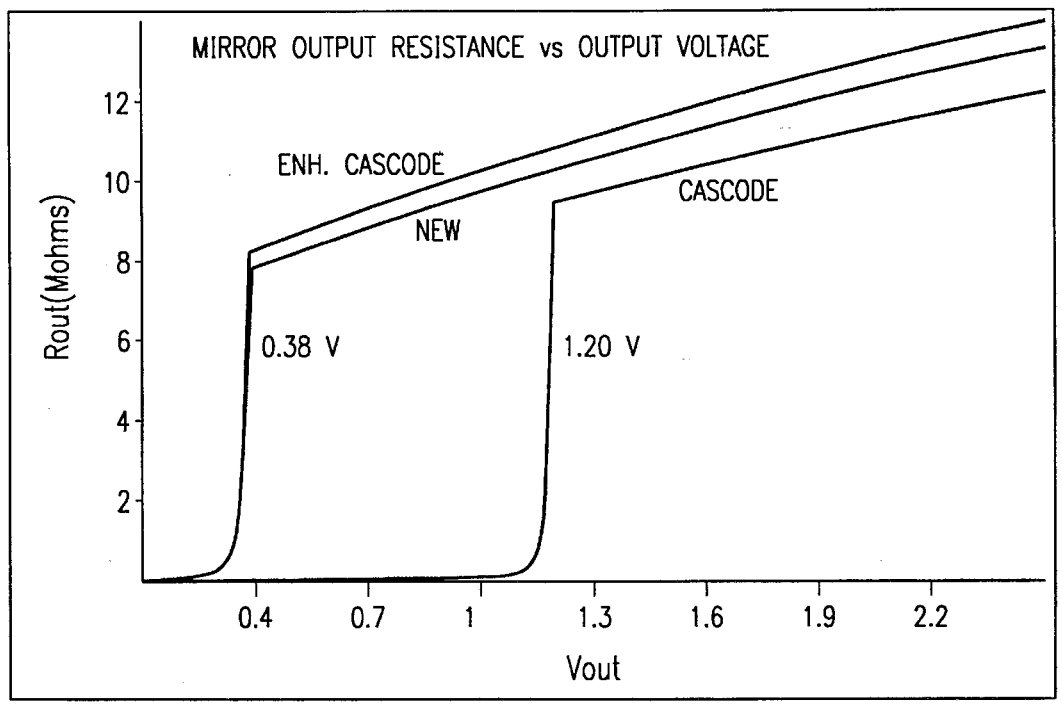
FIGS. 5–7 are graphical representations of experimental data useful in understanding the advantages and features of the invention.
Figure 6:
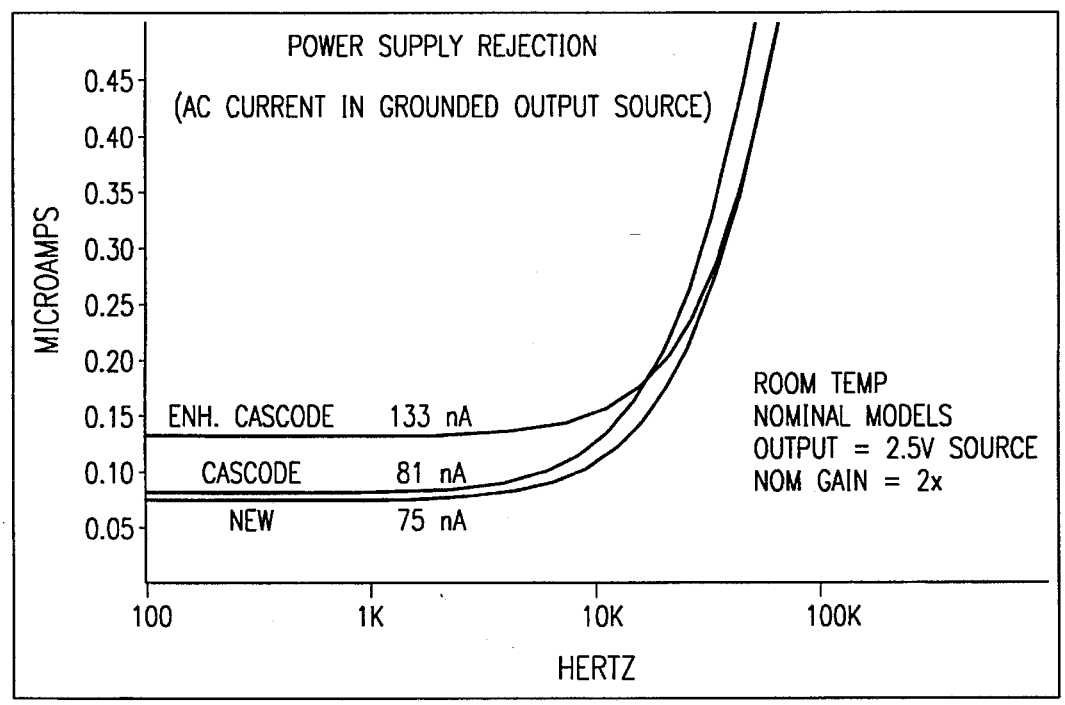
Figure 7:
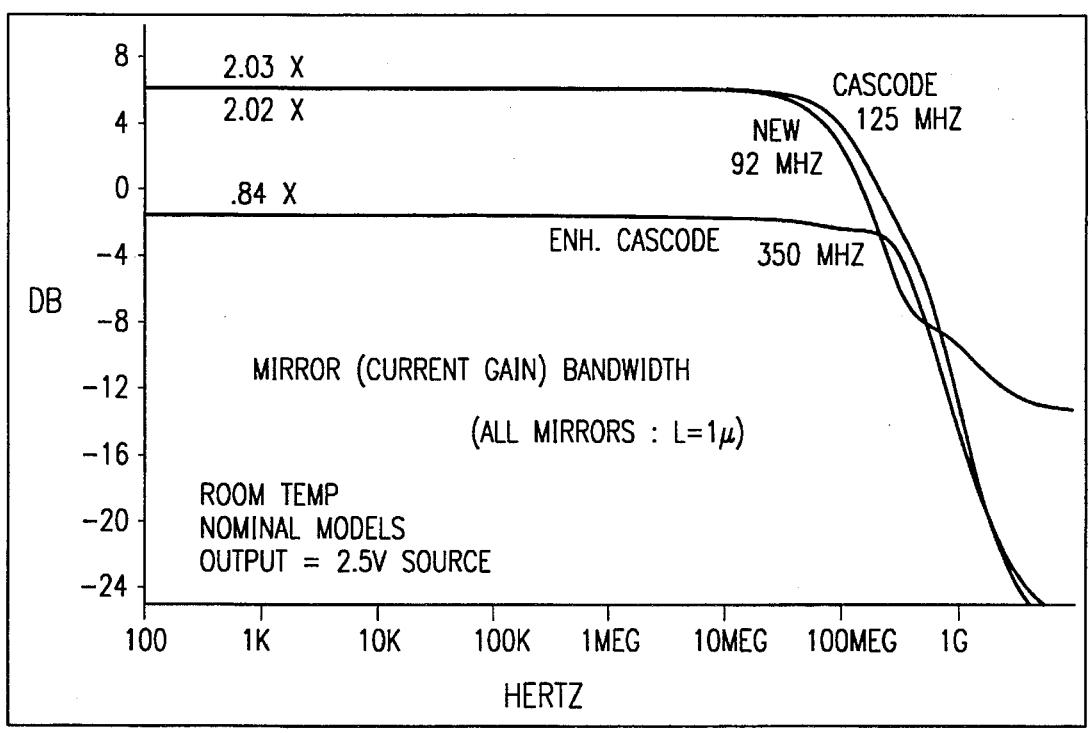

FIG. 5 shows how the new mirror 40 has an output voltage range equivalent to that of the enhanced cascode mirror 30. FIG. 6 shows how the power supply rejection of new mirror 40 exceeds even that of the cascode mirror 20. And, FIG. 7 shows how the strict current gain of the cascode mirror 20 is maintained, as well as how a good bandwidth is also provided.

Those skilled in the art to which the invention relates will appreciate that other substitutions and modifications can be made to the described embodiment, without departing from the spirited scope of the invention as described by the claims below.

What is claimed is:

1. A method for biasing a current mirror circuit having an input terminal; an output terminal; a common voltage terminal; first and second transistors having sources commonly connected to said common voltage terminal, gates commonly connected to each other, and drains; third and fourth transistors having sources respectively connected to said drains of said first and second transistors, gates, and drains respectively connected to said input and output terminals; said method comprising:

providing said third and fourth transistors with commonly connected gates;

providing a fifth transistor having a source connected to said commonly connected third and fourth transistor gates, a gate connected to said third transistor drain, and a drain;

flowing a current through said fifth transistor, for applying a forward biasing voltage at said commonly connected third and fourth transistor gates equal to an input voltage applied at said input terminal, shifted by a voltage differential between said fifth transistor gate and source; and applying a forward biasing voltage at said commonly connected first and second transistor gates.

2. The method of claim 1, wherein said biasing voltage is applied at said commonly connected first and second transistor gates, so that impedance between said first transistor drain and said common voltage terminal is the same as impedance between said second transistor drain and said common voltage terminal.

3. The method of claim 1, wherein said forward biasing voltage is applied at said commonly connected first and second transistor gates by providing another transistor having a source connected to said common voltage terminal, a gate connected to said commonly connected first and second transistor gates, and a drain; and flowing a current through said another transistor.

4. The method of claim 3, wherein said current is flowed through said another transistor to mirror input current flowed through said first and third transistors.

5. The method of claim 4, wherein said another transistor gate is connected to said another transistor drain.

6. The method of claim 4, wherein said current is flowed through said fifth transistor to mirror said input current.

7. The method of claim 6, wherein said current is flowed through said fifth transistor by providing a sixth transistor having a source connected to said common voltage terminal, a gate connected to said commonly connected first and second transistor gates, and a drain connected to said fifth transistor source and commonly connected third and fourth transistor gates.

8. The method of claim 3, wherein said current is flowed through said another transistor by providing yet another transistor having a source connected to said drain of said another transistor, a gate connected to said third transistor drain, and a drain; and flowing said another transistor current through said yet another transistor.

9. The method of claim 8, wherein an identical voltage is applied at said drain of said yet another transistor and said drain of said fifth transistor.

10. The method of claim 1, wherein said current is flowed through said fifth transistor to mirror input current flowed through said first and third transistors.

11. The method of claim 10, wherein said current is flowed through said fifth transistor by providing a sixth transistor having a source connected to said common voltage terminal, a gate connected to said commonly connected first and second transistor gates, and a drain connected to said fifth transistor source and to said commonly connected third and fourth transistor gates.

12. A method for biasing a current mirror circuit having an input terminal; an output terminal; a common voltage terminal; first and second transistors having sources commonly connected to said common voltage terminal, gates commonly connected to each other, and drains; third and fourth transistors having sources respectively connected to said drains of said first and second transistors, gates, and drains respectively connected to said input and output terminals; said method comprising:

providing a fifth transistor having a source connected to said fourth transistor gate, a gate connected to said third transistor drain, and a drain;

flowing a current through said fifth transistor, for applying a forward biasing voltage at said fourth transistor gate equal to an input voltage applied at said input terminal, shifted by a voltage differential between said fifth transistor gate and source;

applying a forward biasing voltage at said third transistor gate equal to said voltage applied at said fourth transistor gate; and applying a forward biasing voltage at said commonly connected first and second transistor gates.

13. The method of claim 12, wherein said forward biasing voltage is applied at said commonly connected first and second transistor gates by providing another transistor having a source connected to said common voltage terminal, a gate connected to said commonly connected first and second transistor gates, and a drain; and flowing a current through said another transistor.

14. The method of claim 13, wherein said current is flowed through said fifth transistor by providing a sixth transistor having a source connected to said common voltage terminal, a gate connected to said commonly connected first and second transistor gates, and a drain connected to said fifth transistor source and commonly connected third and fourth transistor gates.

15. The method of claim 14, wherein said equal voltage is applied at said third transistor gate by commonly connecting said third and fourth transistor gates.

16. The method of claim 14, wherein said current is flowed through said another transistor by providing yet another transistor having a source connected to said drain of said another transistor, a gate connected to said third transistor drain, and a drain; and flowing said another transistor current through said yet another transistor.

17. A method for mirroring output and input currents, comprising:

providing a current mirror circuit having an input terminal; an output terminal; a common voltage terminal; first and second transistors connected in parallel, current mirroring configuration to said common voltage terminal; third and fourth transistors connected in parallel cascoded configuration between respective ones of said input and output terminals and respective ones of said first and second transistors; each of said transistors having first, second and third terminals; said second and third terminals defining a current flow path and said first terminal defining a contact for applying a voltage for controlling current flow through said current flow path; said current flow paths of said first and third transistors defining an input current flow path and said current flow paths of said second and fourth transistors defining an output current flow path;

applying a forward biasing voltage to said first terminal of said fourth transistor by flowing a current through a current flow path between second and third terminals of a fifth transistor under control of voltage applied at a first terminal connected to said input terminal; one of said fifth transistor second and third terminals being connected to said fourth transistor first terminal;

applying a forward biasing voltage to said first terminal of said third transistor equal to said forward biasing voltage applied to said fourth transistor;

applying a forward biasing voltage to said first terminal of said first transistor; and applying a forward biasing voltage to said first terminal of said second transistor equal to said forward biasing voltage applied to said first transistor.

18. The method of claim 17, wherein said biasing voltages applied to said first and second transistors are applied so that impedance between said second and third terminals of said first transistor is the same as impedance between said second and third terminals of said second transistor.

19. The method of claim 18, wherein said biasing voltages applied to said first and second transistors are applied by flowing a current through a current flow path between second and third terminals of another transistor under control of voltage applied at a first terminal of said another transistor connected to said first terminals of said first and second transistors; one of said another transistor second and third terminals being connected to said common voltage terminal.

20. The method of claim 19, wherein said current flowed through said fifth transistor mirrors said input current flowed through said first transistor.

21. The method of claim 20, wherein said current flowed through said another transistor mirrors said input current flowed through said first transistor.

22. The method of claim 21, wherein said third transistor first terminal is connected to said fourth transistor first terminal.

* * * * *